(12) United States Patent
Kim et al.

(10) Patent No.: US 8,145,972 B2
(45) Date of Patent: Mar. 27, 2012

(54) APPARATUS AND METHOD FOR CODING IN COMMUNICATION SYSTEM

(75) Inventors: Dong-Ho Kim, Seoul (KR); Jaehong Kim, Seoul (KR); Myeon-Kyun Cho, Seongnam-si (KR); Steven W. McLaughlin, Atlanta, GA (US)

(73) Assignees: Samsung Electronics Co., Ltd (KR); Georgia Tech Research Corporation, Atlanta, GA (US)

( * ) Notice: Subject to any disclaimer, the term of this patent is extended or adjusted under 35 U.S.C. 154(b) by 1022 days.

(21) Appl. No.: 12/098,765

(22) Filed: Apr. 7, 2008

(65) Prior Publication Data
US 2011/0047432 A1 Feb. 24, 2011

(30) Foreign Application Priority Data
Apr. 5, 2007 (KR) .......................... 10-2007-0033912

(51) Int. Cl.
*G06F 11/00* (2006.01)
(52) U.S. Cl. ....................................................... 714/752
(58) Field of Classification Search .................. None
See application file for complete search history.

(56) References Cited

U.S. PATENT DOCUMENTS

| | | | |
|---|---|---|---|
| 6,895,547 B2 | 5/2005 | Eleftheriou et al. | |
| 7,313,752 B2 | 12/2007 | Kyung et al. | |
| 7,536,623 B2 | 5/2009 | Kim et al. | |
| 7,600,174 B2 | 10/2009 | Kyung et al. | |
| 2006/0291571 A1* | 12/2006 | Divsalar et al. | 375/242 |
| 2009/0217122 A1* | 8/2009 | Yokokawa et al. | 714/752 |

FOREIGN PATENT DOCUMENTS

| | | |
|---|---|---|
| KR | 1020050021108 | 3/2005 |
| KR | 1020060050384 | 5/2006 |
| KR | 1020060061145 | 6/2006 |

* cited by examiner

*Primary Examiner* — Michael Maskulinski
(74) *Attorney, Agent, or Firm* — The Farrell Law Firm, P.C.

(57) ABSTRACT

Disclosed is a method and apparatus for coding in a communication system. The coding method includes generating an information codeword vector from an information vector, generating a first vector in the information vector from an information part of a parity check matrix, generating a first parity codeword vector by performing an exclusive OR operation of the first vector and a second vector corresponding to a cyclically shifted version of the first vector, and generating a second parity codeword vector by performing an exclusive OR operation of the first vector, the first parity codeword vector, and a third vector. The third vector is a cyclically shifted version of a vector resulting from the exclusive OR operation of the first vector, the first parity codeword vector, and a fed-back third vector.

17 Claims, 5 Drawing Sheets

$$[H_{21} \mid H_{22}] = \begin{bmatrix} 1 & 0 & 1 & 0 & 0 & 0 & 0 & 0 \\ 0 & 1 & 0 & 1 & 0 & 0 & 0 & 0 \\ 1 & 0 & 0 & 0 & 1 & 0 & 0 & 0 \\ 0 & 1 & 0 & 0 & 0 & 1 & 0 & 0 \\ 1 & 0 & 1 & 0 & 0 & 0 & 1 & 0 \\ 0 & 1 & 0 & 1 & 0 & 0 & 0 & 1 \\ 0 & 0 & 0 & 0 & 1 & 0 & 1 & 0 \\ 0 & 0 & 0 & 0 & 0 & 1 & 0 & 1 \end{bmatrix}$$

FIG.3

$$[H_{21} \mid H_{22}] = \begin{bmatrix} 1 & 0 & 1 & 0 & 0 & 0 & 0 & 0 \\ 0 & 0 & 1 & 1 & 0 & 0 & 0 & 0 \\ 1 & 0 & 0 & 1 & 1 & 0 & 0 & 0 \\ 1 & 0 & 0 & 0 & 1 & 0 & 0 & 0 \\ 0 & 1 & 0 & 0 & 0 & 1 & 0 & 0 \\ 0 & 1 & 0 & 0 & 0 & 1 & 1 & 0 \\ 0 & 0 & 0 & 0 & 0 & 0 & 1 & 1 \\ 0 & 1 & 0 & 0 & 0 & 0 & 0 & 1 \end{bmatrix}$$

APPARATUS AND METHOD FOR CODING IN COMMUNICATION SYSTEM

PRIORITY

This application claims priority to an application entitled "Apparatus and Method for Coding in Communication System" filed in the Korean Industrial Property Office on Apr. 5, 2007, and assigned Serial No. 2007-0033912, the contents of which are hereby incorporated by reference.

BACKGROUND OF THE INVENTION

1. Field of the Invention

The present invention relates to a communication system, and more particularly to an apparatus and method for coding in a communication system.

2. Description of the Related Art

The most fundamental issue in communication is how to efficiently and reliably transmit data over a channel. In a next-generation communication system that has been actively studied in recent years, a high-speed communication system is required, which departs from an early voice-only service, and can process and transmit a variety of information, such as images, wireless data, and the like. Therefore, it is essential to improve system efficiency by using a channel coding technique appropriate for the system.

Channel codes used for channel coding in a communication system include a Low Density Parity Check (LDPC) code.

The LDPC code is a coding scheme appropriate for a $4^{th}$ generation mobile communication system because it has superior performance to that of a turbo code, has lower decoding complexity than that of the turbo code, and allows fast processing.

Such an LDPC code, which was first introduced by Gallager in 1962, is a linear block code defined by a sparse parity check matrix H, the elements of which are mostly "0". The LDPC code was out of the public's sight and mind because, in view of the state of the art at that time, it was too complex to be implemented. However, MacKay and Neal rediscovered the LDPC code, and demonstrated its excellent performance by using a simple probabilistic decoding method proposed by Gallager.

The LDPC code is defined by a parity check matrix in which most elements have a value of 0, and a small minority of elements other than the zero elements have a value of 1. That is, a parity check matrix of the LDPC code has a very small number of weights, and thus the LDPC code can be decoded through iterative decoding even in the case of a block code with a relatively long length. If the block length of the block code continues to increase, the LDPC code shows performance approaching the channel capacity limit of the Shannon's channel coding theorem. However, one obstacle to implementing the LDPC code is coding complexity. The coding is performed by matrix multiplication, which causes a problem in that coding complexity increases in proportion to the square of code length.

SUMMARY OF THE INVENTION

Accordingly, the present invention has been made to solve at least the above-mentioned problems occurring in the prior art, and the present invention provides an apparatus and method for coding in a communication system.

Further, the present invention provides an apparatus and method for coding in a communication system, which reduces coding complexity.

In accordance with an aspect of the present invention, there is provided a method for coding in a communication system. The method includes generating an information codeword vector from an information vector; generating a first vector in the information vector from an information part of a parity check matrix; generating a first parity codeword vector by performing an exclusive OR operation of the first vector and a second vector corresponding to a cyclically shifted version of the first vector; and generating a second parity codeword vector by performing an exclusive OR operation of the first vector, the first parity codeword vector, and a third vector, wherein the third vector is a cyclically shifted version of a vector resulting from the exclusive OR operation of the first vector, the first parity codeword vector, and the third vector.

In accordance with another aspect of the present invention, there is provided an apparatus for coding in a communication system. The apparatus includes an information codeword vector generation unit for generating an information codeword vector by using an information vector; a matrix product calculation unit for generating a first vector in the information vector by using an information part of a parity check matrix; a first parity codeword vector generation unit for generating a first parity codeword vector by performing an exclusive OR operation of the first vector and a second vector corresponding to a cyclically shifted version of the first vector; and a second parity codeword vector generation unit for generating a second parity codeword vector by performing an exclusive OR operation of the first vector, the first parity codeword vector, and a third vector, wherein the third vector is a cyclically shifted version of a vector resulting from the exclusive OR operation of the first vector, the first parity codeword vector, and the third vector.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENT

Hereinafter, exemplary embodiments of the present invention will be described with reference to the accompanying drawings. It should be noted that the similar components are designated by similar reference numerals although they are illustrated in different drawings. Also, in the following description, a detailed description of known functions and configurations incorporated herein will be omitted when it may obscure the subject matter of the present invention. Further, it should be noted that only parts essential for the understanding at the operations according to the present invention will be described and a description of parts other than the essential parts will be omitted so not to obscure the gist of the present invention.

A coding apparatus and method of the present invention is applicable to a block code. For example, the inventive coding method and apparatus may be applied to a Low Density Parity Check (LDPC) code. In the present invention, a shift register is used to implement the inventive coding method and apparatus.

In addition, the coding method and apparatus of the present invention may also be applied when columns of degree 2 or more are included in a parity part of a parity check matrix.

Figure 1:
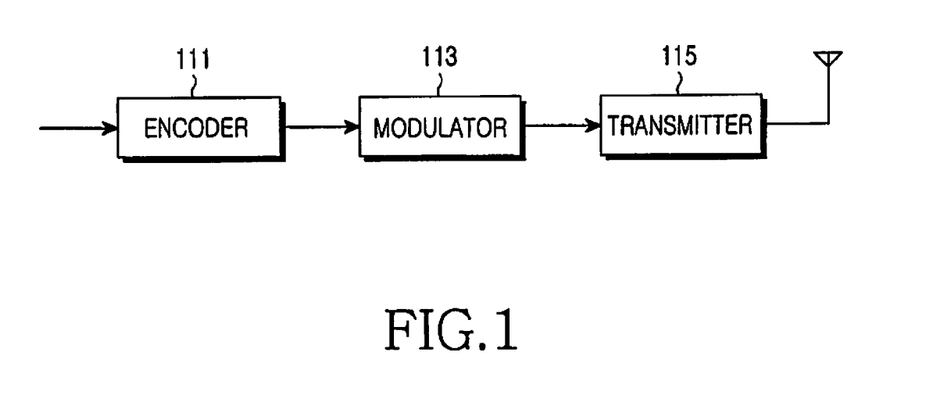
FIG. 1 is a block diagram illustrating a structure of a transmitter apparatus in accordance with an exemplary embodiment of the present invention.

FIG. 1 illustrates a structure of a transmitter apparatus according to an exemplary embodiment of the present invention.

Referring to FIG. 1, the transmitter apparatus of the present invention includes an encoder 111, a modulator 113, and a transmitter 115.

If an information vector to be transmitted occurs in the transmitter apparatus, the information vector is forwarded to the encoder 111. The encoder 111 encodes the information vector according to a predetermined coding scheme to thereby generate a final LDPC codeword vector, and then outputs the generated LDPC codeword vector to the modulator 113. A structure of the encoder according to the present invention will be described in detail below.

The modulator 113 modulates the LDPC codeword vector in a predetermined modulation scheme to thereby generate a modulation vector, and then outputs the generated modulation vector to the transmitter 115. The transmitter 115 receives an input vector, that is, the modulation vector output from the modulator 113, processes the input modulation vector into a transmission signal, and then transmits the transmission signal to a receiver apparatus.

Figure 2:
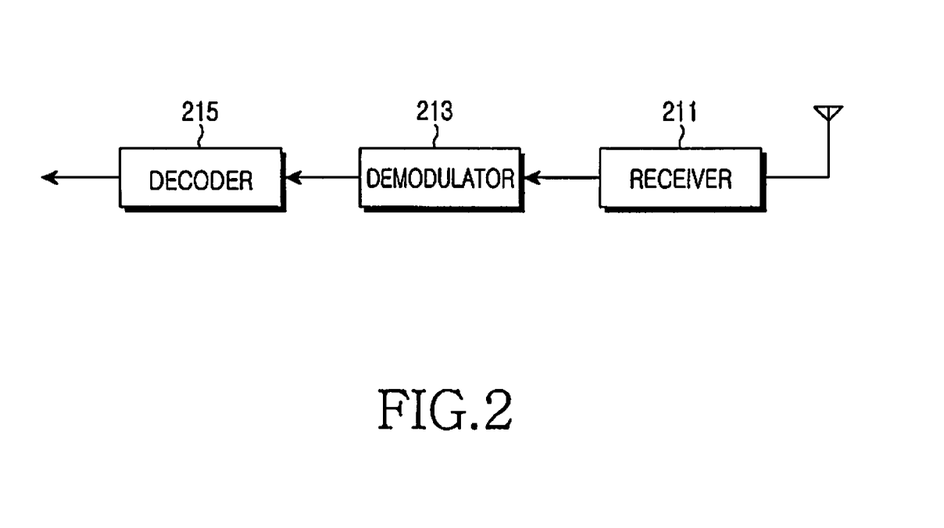
FIG. 2 is a block diagram illustrating a structure of a receiver apparatus in accordance with an exemplary embodiment of the present invention.

FIG. 2 illustrates a structure of a receiver apparatus according to an exemplary embodiment of the present invention.

Referring to FIG. 2, the receiver apparatus of the present invention includes a receiver 211, a demodulator 213, and a decoder 215.

A signal transmitted from the above-mentioned transmitter apparatus to the receiver apparatus is received through an antenna of the receiver apparatus, and the signal received through the antenna is forwarded to the receiver 211.

The receiver 211 processes the signal received through the antennas into a received signal, and then outputs the received signal to the demodulator 213.

The modulator 213 receives an input signal, that is, the received signal output from the receiver 211, demodulates the input received signal in a demodulation scheme corresponding to the modulation scheme applied to the modulator 113 in the transmitter apparatus, and then outputs the demodulated signal to the decoder 215.

The decoder 215 receives an input signal, that is, the demodulated signal output from the demodulator 213, decodes the input demodulated signal in a decoding scheme corresponding to the coding scheme applied to the encoder 111 in the transmitter apparatus, and then outputs the decoded signal as a restored information vector.

When the transmitter apparatus and the receiver apparatus additionally employ an encryption scheme, the transmitter apparatus can transmit an encrypted signal by adding an encryption module to its encoder, and the receiver apparatus can receive the encrypted signal by adding a decryption module to its decoder to thereby decrypt the encrypted signal in a manner corresponding to the encryption in the encryption module.

A parity check matrix H according to the present invention is given in Equation (1):

$$H=[H_1|H_{21}|H_{22}] \quad (1)$$

The parity check matrix includes an information part and a parity part. In Equation (1), $H_1$ denotes an information part, $H_{21}$ denotes a first parity part, and $H_{22}$ denotes a second parity part. $H_1$ is also referred to as a message part or a systematic part, and represents a part of the parity check matrix, which is mapped to an information vector when an LDPC codeword vector is generated by the information vector. The first parity part represents a part of the parity check matrix, which is mapped to a first parity vector, and the second parity part represents a part of the parity check matrix, which is mapped to a second parity vector. The first parity part is a partial matrix consisting of columns with a column weight of 3, and the second parity part is a partial matrix consisting of columns with a column weight of 2.

The encoder of the present invention can encode all block codes including an LDPC code, and uses a parity part of a parity check matrix, which satisfies the following conditions:

1. Each row constituting a first parity part must have a row weight of 1 or less; and
2. A second parity part must be in the form of a lower triangular matrix.

First and second parity parts according to the present invention, which satisfy the above conditions, will be described with reference to FIGS. 3 and 4.

Figure 3:
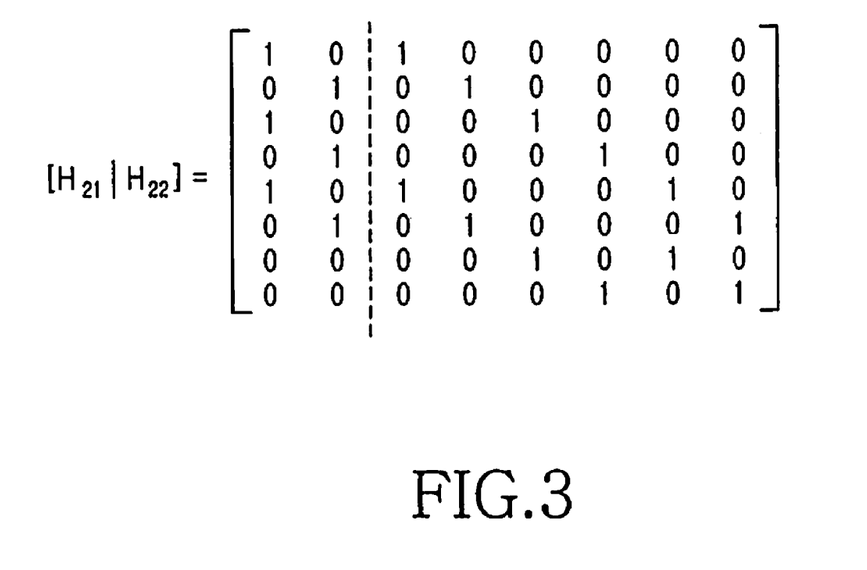
FIG. 3 is a diagram illustrating a parity part of a parity check matrix in accordance with an exemplary embodiment of the present invention.

FIG. 3 illustrates a parity part of a parity check matrix according to an exemplary embodiment of the present invention.

Referring to FIG. 3, each row of a first parity part has a row weight of 1 or less, and a second parity part is in the form of a lower triangular matrix. Thus, both the parity parts satisfy all of the above conditions.

Figure 4:
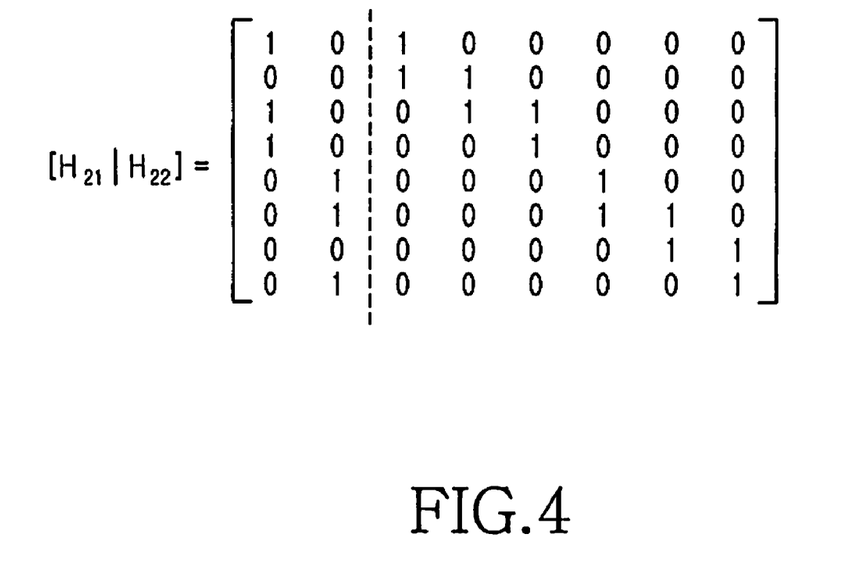
FIG. 4 is a diagram illustrating a parity part of a parity check matrix in accordance with another exemplary embodiment of the present invention.

FIG. 4 illustrates a parity part of a parity check matrix according to another exemplary embodiment of the present invention.

Referring to FIG. 4, each row of a first parity part has a row weight of 1 or less, and a second parity part is in the form of a lower triangular matrix. Thus, both the parity parts also satisfy all of the above conditions.

In the parity parts of FIGS. 3 and 4, let L be the number of columns of degree 3, and let M be the total number of parity symbols. Then, the first parity part is an (M×L) matrix, and the second parity part is an (M×(M−L)) matrix. A codeword vector c is given in Equation (2):

$$c=[m|p_1|p_2] \quad (2)$$

The codeword vector includes an information codeword vector, that is, an information symbol, and a parity codeword vector, that is, a parity symbol. In Equation (2), m denotes an information codeword vector, $p_1$ denotes a first parity symbol or a first parity codeword vector, and $p_2$ denotes a second parity symbol or a second parity codeword vector. The first parity codeword vector is a parity column of degree 3, and the second parity codeword vector is a parity column of degree 2.

Due to the characteristics of a block code, a relationship as given in Equation (3) is established between a parity check matrix and a codeword vector:

$$H \cdot c^T = [H_1 | H_{21} | H_{22}] \cdot [m | p_1 | p_2]^T = H_1 m^T + H_{21} p_1^T + H_{22} p_2^T = 0 \quad (3)$$

Assuming $s^T = H_1 m^T$, s is a vector corresponding to the product of the transpose matrix of an information part of a parity check matrix and an information codeword vector. Under this assumption, Equation (4) can be derived from Equation (3):

$$H_{21} p_1^T = H_1 m^T + H_{22} p_2^T = s^T + H_{22} p_2^T \quad (4)$$

In Equation (4), when $h_{22j}$ is the jth row of $H_{22}$, it is possible to select several rows satisfying $$\sum_j h_{22j} p_2^T = 0$$

because the column weight of $H_{22}$ is 2. If a set of such rows is defined as $R_i (R_1 \subseteq \{1, 2, \ldots, M\})$, Equation (5) is established:

$$\sum_{j=R_i} h_{22} p_2^T = 0 \quad (5)$$

In Equation (5), j denotes the index of a row selected from $H_{22}$.

Also, if $r_i$ ($r_i \subset R_i$) is a set of three elements selected from $R_i$, then elements with a value of 1 are selected as $r_i$ from among columns of $H_{21}$ because the column weight of $H_{21}$ is 3 and the row weight of $H_{21}$ is less than or equal to 1. Let $p_{1i}$ be ith element of $p_1$ ($1 \leq i \leq L$). Then, $p_{1i}$ is expressed by Equation (6):

$$p_{1i} = \sum_{j \in r_i} s_j \quad (6)$$

In Equation (6), $p_{1i}$ can be represented by a simple sum of $s_j$.

For example, let $p_{11}$ be an element of $p_1$, corresponding to the first column of the matrix shown in FIG. 3, and let $p_{12}$ be an element of $p_1$, corresponding to the second column of the matrix shown in FIG. 3. Then, $p_{11}$ and $p_{12}$ can be expressed by Equation (7):

$$p_{11} = s_1 + s_3 + s_5 + s_7$$
$$p_{12} = s_2 + s_4 + s_6 + s_8 \quad (7)$$

Also, let $p_{11}$ be an element of $p_1$, corresponding to the first column of the matrix shown in FIG. 4, and let $p_{12}$ be an element of $p_1$, corresponding to the second column of the matrix shown in FIG. 3. Then, $p_{11}$ and $p_{12}$ can be expressed by Equation (8):

$$p_{11} = s_1 + s_2 + s_3 + s_4$$
$$p_{12} = s_5 + s_6 + s_7 + s_8 \quad (8)$$

In Equations (7) and (8), $s_i$ denotes the ith row, and corresponds to a position where an element with a value of 1 is located. Equation (8) results from applying Equation (4). This can be ascertained by examining the sum of rows 1, 2, 3 and 4 in FIG. 4.

Thus, once $p_1$ is obtained, $p_2$ can be obtained using a sliding window scheme or a backward substitution scheme. In the present invention, a time-varying divider circuit employing the sliding window scheme is used by way of example.

Figure 5:
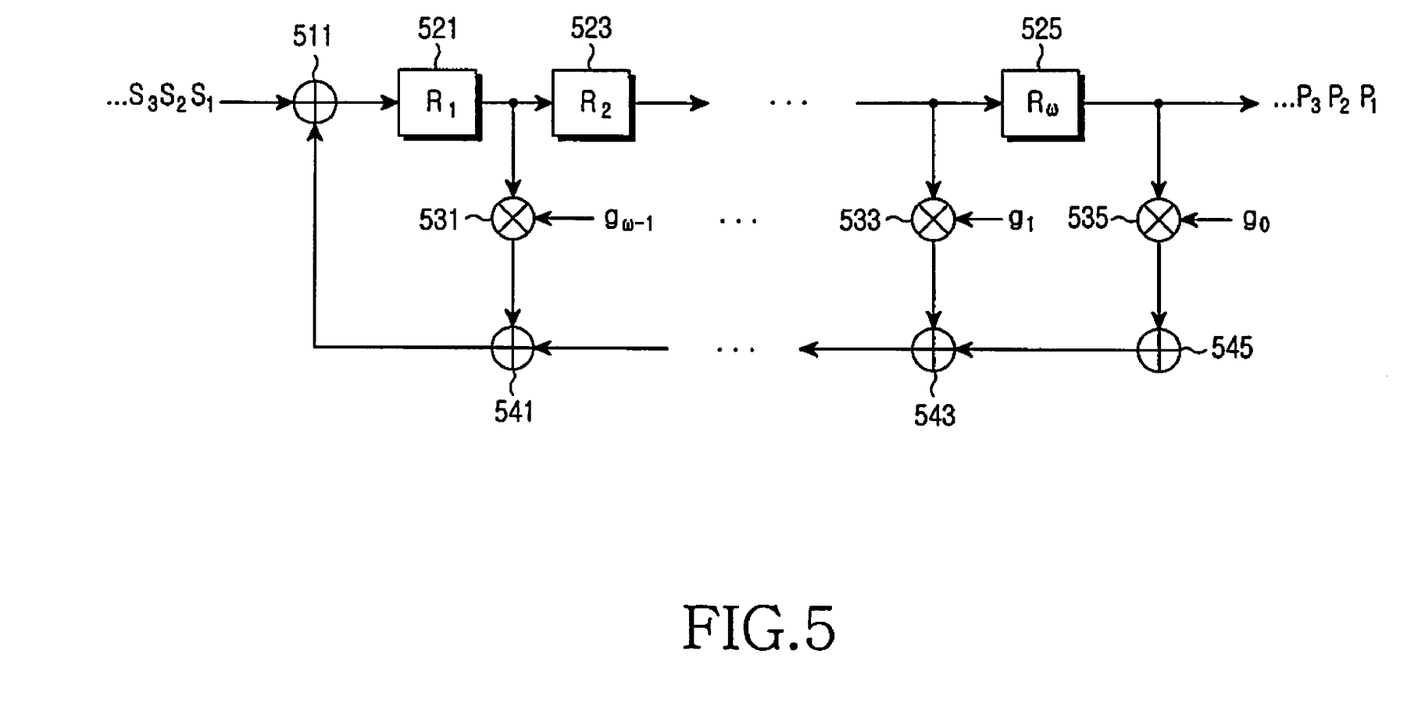
FIG. 5 is a block diagram illustrating a divider circuit in accordance with an exemplary embodiment of the present invention.

A cyclic code that is a type of block code may be implemented by a divider circuit, and such a divider circuit is illustrated in FIG. 5.

FIG. 5 illustrates a divider circuit according to an exemplary embodiment of the present invention.

Referring to FIG. 5, the divider circuit includes exclusive OR (XOR) operators 511, 541, 543 and 545, shift registers 521, 523 and 525, and multipliers 531, 533 and 535.

The first XOR operator 511 outputs a first XOR operation signal by performing an XOR operation of a vector s and a signal output from the second XOR operator 541. The vector s is a vector corresponding to the product of the transpose matrix of an information part of a parity check matrix and an input formation vector, and may be represented by $s_1$ to $s_{M-1}$.

The first shift register 521 cyclically shifts the first XOR operation signal, and outputs the cyclically shifted first XOR signal to the second shift register 523.

That is, an output of the first shift register 521 is input into the second shift register 523, and an output of each shift register is input into each subsequent shift register. In this way, outputs of the respective shift registers are sequentially output up to the wth shift register 525.

The respective shift registers 521, 523 and 525 cyclically shift the input first XOR operation signal in sequence. The wth shift register 525 outputs parity vectors.

Also, each of the first shift register 521 to the wth shift register 525 outputs each of the cyclically shifted first XOR operation signals to each of the first multiplier 531 to the wth multiplier 535.

The first multiplier 531 to the wth multiplier 535 generate weight factor multiplication signals by multiplying the respective cyclically shifted first XOR operation signals by weight factors, that is, $g_0$ to $g_{w-1}$. The weight factors become coefficients of a generator polynomial when the divider circuit of FIG. 5 is designed using a polynomial. The first multiplier 531 multiplies the cyclically shifted first XOR operation signal by a weight factor of $g_{w-1}$, the (w−1)th multiplier 533 multiplies the cyclically shifted first XOR operation signal by a weight factor of $g_1$, and the wth multiplier 535 multiplies the cyclically shifted first XOR operation signal by a weight factor of $g_0$.

The weight factor multiplication signals are output to the second XOR operator 541 to the (w+1)th XOR operator 545 respectively, and the XOR operators 541, 543 and 545 output XOR operation signals to the first XOR operator 511 respectively.

With regard to this, the (w+1)th XOR operator 545 performs an XOR operation of outputs of the wth multiplier 535, and outputs its XOR operation signal to the wth XOR operator 543. The wth XOR operator 543 receives an output of the (w−1)th multiplier 533 and an output of the (w+1)th XOR operator 535, performs an XOR operation thereof, and outputs its XOR operation signal to the second XOR operator 541. The second XOR operator 541 receives an output of the first multiplier 531 and an output of the wth XOR operator 543, performs an XOR operation thereof, and outputs its XOR operation signal to the first XOR operator 511.

As an example, the XOR operators 511, 541, 543 and 545 perform an XOR operation in which a bit of "0" is output when input information bits are the same, and a bit of "1" is output when input information bits are different.

The divider circuit of FIG. 5 may also be designed using a polynomial, and such a polynomial is referred to as a generator polynomial. Let g(x) be the generator polynomial. The polynomial g(x) is expressed by Equation (9):

$$g(x)=g_0+g_1x+g_2x^2+\ldots+g_{w-1}x^{w-1}+x^w \quad (9)$$

In Equation (9), operations for obtaining coefficients $g_i$ of the generator polynomial are performed by the multiplier between the shift registers and the XOR operators. Thereupon, an encoder according to the present invention can be implemented using a divider circuit expressible by a generator polynomial whose coefficients may be time varying. Thus, as an example, the divider circuit may be a time-varying divider circuit for performing a time-varying division operation. In the present invention, time-varying coefficients, that is, the coefficients of the generator polynomial, are obtained using, for example, a parity part of a parity check matrix.

Figure 6:
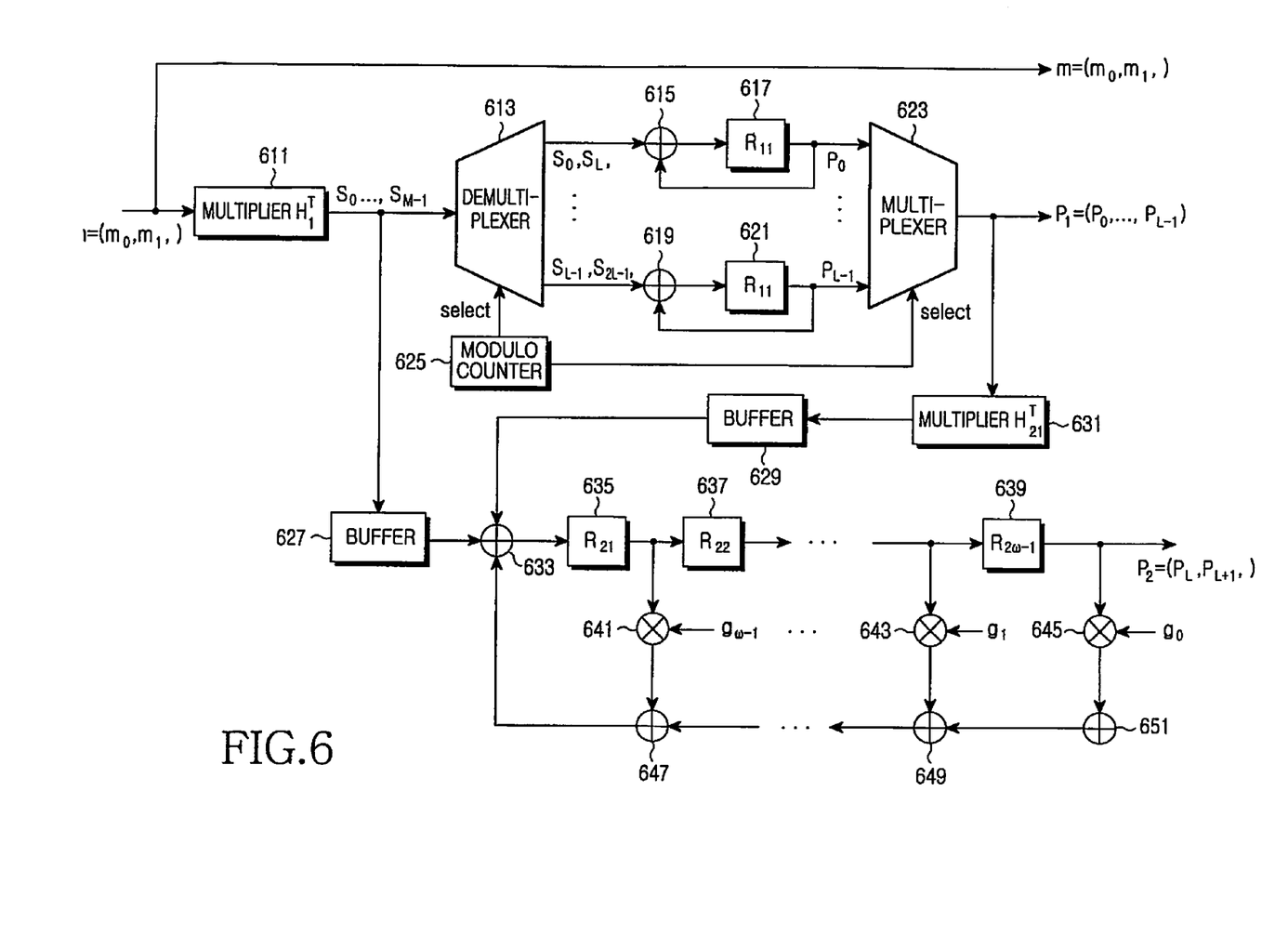
FIG. 6 is a block diagram illustrating a structure of an encoder in accordance with an exemplary embodiment of the present invention.

FIG. 6 illustrates a structure of an encoder according to an exemplary embodiment of the present invention.

Referring to FIG. 6, the encoder of the present invention includes an information codeword vector generation unit, a matrix product calculation unit, a first parity codeword vector ($p_1$) generation unit, and a second parity codeword vector ($p_2$) generation unit.

The matrix product calculation unit includes a multiplier 611. The first parity codeword vector generation unit includes a demultiplexer 613, a first XOR operator 615 to an Lth XOR operator 619, a first shift register 617 to an Lth shift register 621, a multiplexer 623 and a modulo counter 625. The second parity codeword vector generation unit includes a second multiplier 631, a first buffer 627, a second buffer 629, a first XOR operator 633, a first shift register 635 to a wth shift register 639, a third multiplier 641 to a wth multiplier 645, and a second XOR operator 647 to a (w+1) the XOR operator 651.

Here, the XOR operators and the shift registers of the first and second parity codeword vector generation units are equally named for the convenience of explanation in the respective structures of the parity codeword vector generation units, and will be identified by reference numerals in the following description.

The information codeword vector generation unit uses an information vector, input into the encoder, as an information codeword vector m.

The multiplier 611 of the matrix product calculation unit multiplies the input information vector in by the transpose matrix $H_1^T$ of an information part to thereby generate vectors $s_1$ to $s_{M-1}$, and outputs the generated vectors $s_1$ to $s_{M-1}$ to the demultiplexer 613 of the first parity codeword vector generation unit and the first buffer 627 of the second parity codeword vector generation unit.

The first parity codeword vector generation unit operates as follows.

The modulo counter 625 provides a selection signal for demultiplexing a signal in the demultiplexer 613 or a selection signal for multiplexing a signal input into the multiplexer 623. The modulo counter 625 also outputs selection signals, the number of which corresponds to the number of the XOR operators or the shift registers, for example, L selection signals.

The demultiplexer 613 receives an input vector corresponding to the product of an input information vector and the transpose matrix of an information part of a parity check matrix, demultiplexes the input vector by using a selection signal of the modulo counter 625, and outputs the demultiplexed vector to the first XOR operator 615 to the Lth XOR operator 619.

Each of the first XOR operator 615 to the Lth XOR operator 619 receives an output signal fed back from each of the first shift register 617 to the Lth shift register 621, receives an output vector of the demultiplexer 613, and performs an XOR operation of the output signal and the output vector. Also, each of outputs of the first XOR operator 615 to the Lth XOR operator 619 is input into each of the first shift register 617 to the Lth shift register 621.

Each of the first shift register 617 to the Lth shift register 619 cyclically shifts an input signal, and outputs the cyclically shifted signal to the multiplexer 623.

The multiplexer 623 multiplexes an input signal by using a selection signal output from the modulo counter 625 to thereby generate a first parity codeword vector.

The second parity codeword vector generation unit operates as follows.

The second multiplier 631 multiplies the first parity codeword vector, output from the multiplexer 623, by the transpose matrix $H_{21}^T$ of a first parity part, and outputs the resultant vector to the second buffer 629. The second buffer 629 stores vectors output from the multiplier 631, and outputs the stored vectors to the first XOR operator 633.

The first buffer 627 stores output vectors of the multiplier 611, that is, the vectors $s_1$ to $s_{M-1}$, and outputs the stored vectors $s_1$ to $s_{M-1}$ to the first XOR operator 633.

Output signals of the first buffer 627 and the second buffer 629 are input into a divider circuit similar to that described in FIG. 5, that is, the first XOR operator 633.

Thereupon, the first XOR operator 633 performs an XOR operation of input signals.

The first XOR operator 633 receives input signals, that is, output signals of the first buffer 627, the second buffer 629, and the second XOR operator 647, performs an XOR operation of the input signals, and outputs the resultant value of the XOR operation to the first shift register 635.

An output of the first shift register 635 is input into the second shift register 637, and an output of each shift register is input into each subsequent shift register. In this way, outputs of the respective shift registers are sequentially output up to the wth shift register 639.

The respective shift registers 635, 637 and 639 cyclically shift an input signal, that is, an output of the first XOR operator 633, in sequence. The wth shift register 639 outputs parity vectors.

Also, an output of each of the first shift register 635 to the wth shift register 639 is input into each of the first multiplier 641 to the wth multiplier 645.

The first multiplier 641 to the wth multiplier 645 multiply outputs of the shift registers 635, 637, 639 by weight factors, that is, $g_0$ to $g_{w-1}$ respectively. The weight factors become coefficients of a generator polynomial when the divider circuit is designed using a polynomial. More specially, the first multiplier 641 multiplies an output of the first shift register 635 by a weight factor of $g_{w-1}$, the (w−1)th multiplier 643 multiplies an output of the (w−1)th shift register by a weight factor of $g_1$, and the wth multiplier 645 multiplies an output of the wth shift register 639 by a weight factor of $g_0$.

Outputs of the multipliers 641, 643 and 645 are output to the second XOR operator 647 to the (w+1)th XOR operator 651 respectively, and the XOR operators 647, 649 and 651 output XOR operation signals to the first XOR operator 633 respectively.

With regard to this, the (w+1)th XOR operator 651 performs an XOR operation of outputs of the wth multiplier 645, and outputs its XOR operation signal to the wth XOR operator 649. The wth XOR operator 649 receives an output of the (w−1)th multiplier 643 and an output of the (w+1)th XOR operator 651, performs an XOR operation thereof, and outputs its XOR operation signal to the second XOR operator

647. The second XOR operator 647 receives an output of the first multiplier 641 and an output of the wth XOR operator 649, performs an XOR operation thereof, and outputs its XOR operation signal to the first XOR operator 633.

As an example, the XOR operators 615, 619, 633, 647, 649 and 651 perform an XOR operation in which a bit of "0" is output when input information bits are the same, and a bit of "1" is output when input information bits are different.

Using the encoder structure of FIG. 6, a codeword vector including an information codeword vector and a parity codeword vector can be generated from an input information vector.

Figure 7:
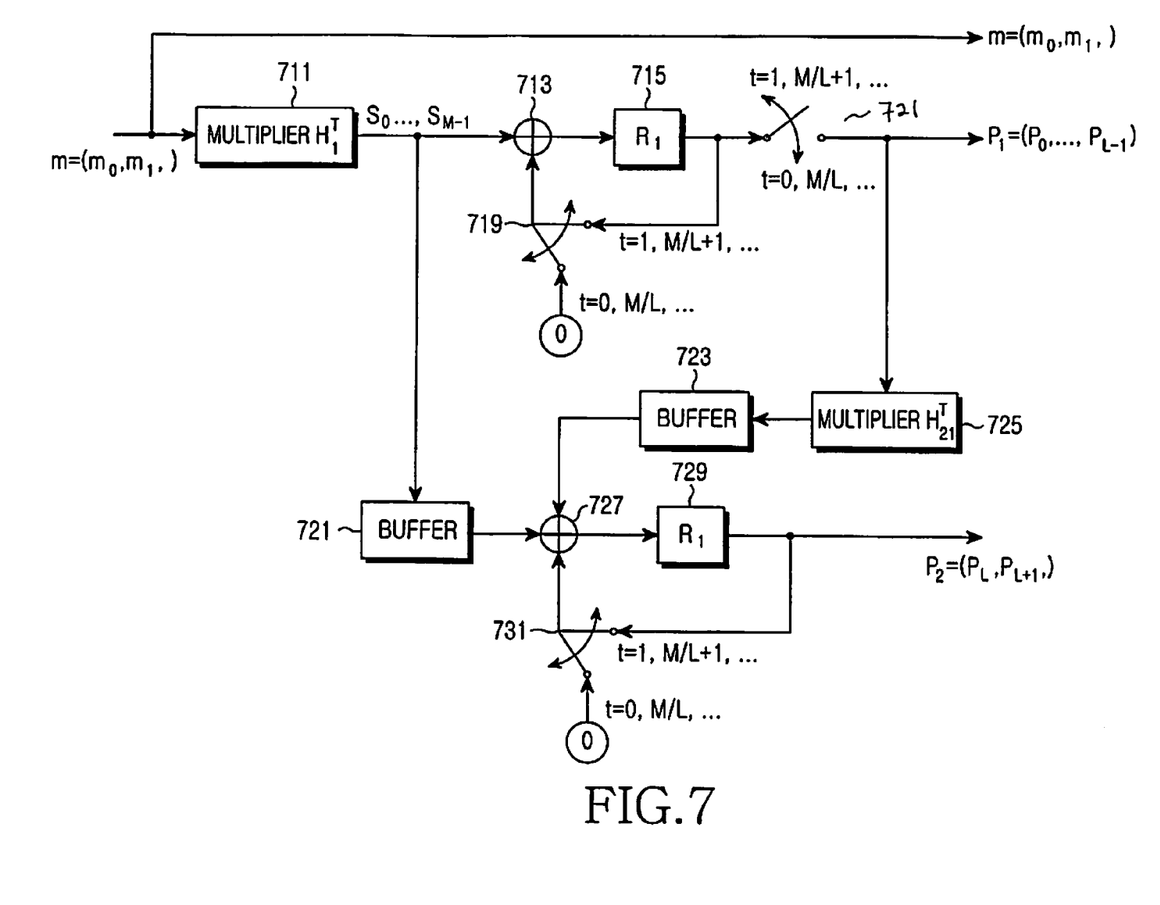
FIG. 7 is a block diagram illustrating a structure of an encoder in accordance with another exemplary embodiment of the present invention.

FIG. 7 illustrates a structure of an encoder according to anther exemplary embodiment of the present invention.

Referring to FIG. 7, the encoder of the present invention includes an information codeword vector generation unit, a matrix product calculation unit, a first parity codeword vector ($p_1$) generation unit, and a second parity codeword vector ($p_2$) generation unit.

The matrix product calculation unit includes a first multiplier 711. The first parity codeword vector generation unit includes a first XOR operator 713, a first shift register 715, a first switch 719 and a second switch 721. The second parity codeword vector generation unit includes a second multiplier 725, a first buffer 721, a second buffer 723, a second XOR operator 727, a second shift register 729 and a third switch 731.

The first multiplier 711 of the matrix product calculation unit multiplies an input information vector m by the transpose matrix $H_1^T$ of an information part $H_1$ of a parity check matrix to thereby generate vectors $s_1$ to $s_{M-1}$, and outputs the generated vectors $s_1$ to $s_{M-1}$ to the first XOR operator 713 of the first parity codeword vector generation unit and the first buffer 721 of the second parity codeword vector generation unit.

The information codeword vector generation unit uses the input information vector as an information codeword vector m.

The first parity codeword vector generation unit operates as follows.

The first XOR operator 713 performs an XOR operation of input signals, and outputs its XOR operation signal to the first shift register 715. Also, an output of the first shift register 715 is fed back to the first XOR operator 713, and the first XOR operator 713 performs an XOR operation of the fed-back output and a signal input into the first XOR operator 713.

When an output of the first shift register 715 is input into the first XOR operator 713, the first switch 719 is configured such that a zero (0) signal or a feedback signal of the first shift register 715 is switched to the first XOR operator 713 according to each point in time. Here, as an example, the zero (0) signal may be implemented by a "0" signal or "0" inserter (not shown) connected with the first switch 719.

The first shift register 715 switches a signal according to each time through the second switch 721 to thereby output a first parity codeword vector $p_i$.

The second parity codeword vector generation unit operates as follows.

The second multiplier 725 multiplies the first parity codeword vector, output from the first shift register 715, by the transpose matrix $H_{21}^T$ of a first parity part $H_{21}$, and outputs the resultant vector to the second buffer 723. The second buffer 723 stores vectors output from the multiplier 725, and outputs the stored vectors to the second XOR operator 727.

The first buffer 721 stores output vectors of the first multiplier 711, that is, the vectors $s_1$ to $s_{M-1}$, and outputs the stored vectors $s_1$ to $s_{M-1}$ to the second XOR operator 727.

Output signals of the first buffer 721 and the second buffer 723 are input into the second XOR operator 727.

The second XOR operator 727 performs an XOR operation of input signals, and outputs its XOR operation signal to the second shift register 729. Also, an output of the second shift register 729 is fed back to the second XOR operator 727, and the second XOR operator 727 performs an XOR operation of the fed-back output and a signal input into the second XOR operator 727.

When an output of the second shift register 729 is input into the second XOR operator 727, the third switch 731 is configured such that a zero (0) signal or a feedback signal of the second shift register 729 is switched to the second XOR operator 727 according to each time. Here, as an example, the zero (0) signal may be implemented by a "0" signal or "0" inserter (not shown) connected with the third switch 731.

The second shift register 729 output a second parity codeword vector $p_2$.

The first parity codeword vector generation unit or the second parity codeword vector generation unit may use, for example, a differential encoder for performing differential encoding as describe above, and requires a function of periodically resetting the registers. The differential encoder includes XOR operators, registers, switches, and so forth.

A codeword c generated by the encoder of FIG. 6 or 7 includes an information part codeword vector m, a first parity part codeword vector $p_1$, and a second parity part codeword vector $p_2$. As an example, the first parity part codeword vector has a column weight of 3, and second parity part codeword vector has a column weight of 2. In the foregoing, M denotes the number of parity symbols, w denotes a window size, and L denotes the number of parity parts with a column weight of 3.

The use of the inventive encoder makes it possible to perform coding by using a parity check matrix, the parity part of which includes columns of degree 3 or more.

In a decoder corresponding to such an encoder, an information vector coded in the encoder can be restored through decoding using a parity check matrix used for coding in the encoder.

As described above, by implementing an encoder based on a method and apparatus for coding in a communication system, proposed in the present invention, coding complexity can be reduced. Also, it is possible to perform coding by using a parity check matrix including columns of degree 3 or more.

While the invention has been shown and described with reference to a certain exemplary embodiment thereof, it will be understood by those skilled in the art that various changes in form and details may be made therein without departing from the spirit and scope of the invention as defined by the appended claims and equivalents thereof.

What is claimed is:

1. A method for coding in a communication system, the method comprising the steps of:

generating, by an information codeword vector generation unit, an information codeword vector from an information vector;

generating, by a matrix product calculation unit, a first vector in the information vector from an information part of a parity check matrix;

generating, by a first parity codeword vector generation unit, a first parity codeword vector by performing an exclusive OR operation of the first vector and a second vector corresponding to a cyclically shifted version of the first vector; and generating, by a second parity codeword vector generation unit, a second parity codeword vector by performing an exclusive OR operation of the first vector, the first parity codeword vector, and a third vector, wherein the third vector is a cyclically shifted version of a vector resulting from the exclusive OR operation of the first vector, the first parity codeword vector, and a fed-back third vector.

2. The method as claimed in claim 1, wherein a first parity part of the parity check matrix comprises a matrix with a column weight of 3 or more.

3. The method as claimed in claim 2, wherein the first parity part of the parity check matrix includes rows, each of which has a row weight of 1 or less.

4. The method as claimed in claim 1, wherein the step of generating the second parity codeword vector comprises:
performing the exclusive OR operation of the first vector, the first parity codeword vector, and the third vector;
cyclically shifting a fourth vector, resulting from the exclusive OR operation, in sequence by using at least one cyclic shift value, thereby generating at least two cyclically shifted fifth vectors;
generating the third vector by multiplying the fifth vectors by weight factors; and
feeding back the third vector to the exclusive OR operation, and performing the exclusive OR operation by using the fed-back third vector.

5. The method as claimed in claim 4, wherein the weight factors vary according to time.

6. The method as claimed in claim 1, wherein the step of generating the second parity codeword vector comprises:
performing the exclusive OR operation of the first vector, the first parity codeword vector, and the third vector;
cyclically shifting a fourth vector resulting from the exclusive OR operation;
generating the third vector by switching the cyclically shifted fourth vector and a zero (0) signal; and
feeding back the third vector to the exclusive OR operation, and performing the exclusive OR operation by using the fed-back third vector.

7. An apparatus for coding in a communication system, the apparatus comprising:
an information codeword vector generation unit for generating an information codeword vector from an information vector;
a matrix product calculation unit for generating a first vector in the information vector from an information part of a parity check matrix;
a first parity codeword vector generation unit for generating a first parity codeword vector by performing an exclusive OR operation of the first vector and a second vector corresponding to a cyclically shifted version of the first vector; and
a second parity codeword vector generation unit for generating a second parity codeword vector by performing an exclusive OR operation of the first vector, the first parity codeword vector, and a third vector,
wherein the third vector is a cyclically shifted version of a vector resulting from the exclusive OR operation of the first vector, the first parity codeword vector, and a fed-back third vector.

8. The apparatus as claimed in claim 7, wherein a first parity part of the parity check matrix comprises a matrix with a column weight of 3 or more.

9. The apparatus as claimed in claim 7, wherein a first parity part of the parity check matrix includes rows, each of which has a row weight of 1 or less.

10. The apparatus as claimed in claim 7, wherein the matrix product calculation unit comprises a multiplier for generating the first vector by multiplying the information vector by a transpose matrix of the information part of the parity check matrix.

11. The apparatus as claimed in claim 7, wherein the first parity codeword vector generation unit comprises:
a demultiplexer for demultiplexing the first vector;
at least two shift registers for generating at least two second vectors by cyclically shifting the demultiplexed first vector in sequence;
first exclusive OR operators for generating fifth vectors by performing exclusive OR operations of the demultiplexed first vector and respective at least two second vectors;
a multiplexer for generating a first parity codeword by multiplexing the fifth vectors; and
a modulo counter for outputting a selection signal for demultiplexing the first vector to the demultiplexer, and outputting a selection signal for multiplexing the fifth vectors to the multiplexer.

12. The apparatus as claimed in claim 11, wherein the second parity codeword vector generation unit comprises:
a second exclusive OR operator for performing the exclusive OR operation of the first vector, the first parity codeword vector, and the third vector;
at least two shift registers for cyclically shifting a sixth vector, resulting from the exclusive OR operation, in sequence by using at least one cyclic shift value, thereby generating at least two cyclically shifted seventh vectors;
at least two weight factor multipliers for multiplying the seventh vectors by weight factors; and
a third exclusive OR operator for generating the third vector by performing an exclusive OR operation of the seventh vectors multiplied by the weight factors,
wherein the second exclusive OR operator feeds back the third vector generated by the third exclusive OR operator, and performs the exclusive OR operation by using the fed-back third vector.

13. The apparatus as claimed in claim 12, wherein the weight factors vary according to time.

14. The apparatus as claimed in claim 12, wherein the second exclusive OR operator performs the exclusive OR operation by multiplying the first parity codeword vector by a transpose matrix of the information part of the parity check matrix.

15. The apparatus as claimed in claim 7, wherein the first parity codeword vector generation unit comprises:
a shift register for generating the second vector by cyclically shifting the first vector;
a first switch for switching the second vector and a zero (0) signal;
a first exclusive OR operator for performing the exclusive OR operation of the first vector and the second vector; and
a second switch for generating the first parity codeword vector by switching the second vector.

16. The apparatus as claimed in claim 15, wherein the second parity codeword vector generation unit comprises:

a second exclusive OR operator for performing the exclusive OR operation of the first vector, the first parity codeword vector, and the third vector;

shift register for cyclically shifting a fifth vector resulting from the exclusive OR operation; and a third switch for generating the third vector by switching the cyclically shifted fifth vector and a zero (0) signal, wherein the third vector generated in the third switch is fed back to the second exclusive OR operator, and the second exclusive OR operator performs the exclusive OR operation by using the fed-back third vector.

17. The apparatus as claimed in claim 16, wherein the second exclusive OR operator performs the exclusive OR operation by multiplying the first parity codeword vector by a transpose matrix of the information part of the parity check matrix.

* * * * *